US007927783B2

(12) United States Patent (10) Patent No.: US 7,927,783 B2
Aizenberg et al. (45) Date of Patent: Apr. 19, 2011

(54) TUNABLE LITHOGRAPHY WITH A REFRACTIVE MASK

(75) Inventors: Joanna Aizenberg, Union County, NJ (US); Shu Yang, Philadelphia, PA (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 1671 days.

(21) Appl. No.: 10/920,673

(22) Filed: Aug. 18, 2004

(65) Prior Publication Data

US 2006/0040213 A1 Feb. 23, 2006

(51) Int. Cl.
*G03C 5/04* (2006.01)
*G03F 7/20* (2006.01)
(52) U.S. Cl. ......... 430/396; 430/312; 430/313; 430/394
(58) Field of Classification Search ................. None
See application file for complete search history.

(56) References Cited

U.S. PATENT DOCUMENTS

| | | | | | |
|---|---|---|---|---|---|
| 4,030,813 | A | * | 6/1977 | Kohashi et al. | 350/161 S |
| 4,948,214 | A | * | 8/1990 | Hamblen | 350/413 |
| 5,248,734 | A | * | 9/1993 | Ober et al. | 525/328.8 |
| 5,428,711 | A | * | 6/1995 | Akiyama et al. | 395/25 |
| 5,659,330 | A | * | 8/1997 | Sheridon | 345/84 |
| 5,665,527 | A | * | 9/1997 | Allen et al. | 430/325 |
| 5,948,470 | A | * | 9/1999 | Harrison et al. | 427/198 |
| 6,014,259 | A | * | 1/2000 | Wohlstadter | 359/619 |
| 6,369,954 | B1 | * | 4/2002 | Berge et al. | 359/666 |
| 6,379,874 | B1 | * | 4/2002 | Ober et al. | 430/322 |
| 6,538,823 | B2 | * | 3/2003 | Kroupenkine et al. | 359/665 |
| 6,545,815 | B2 | * | 4/2003 | Kroupenkine et al. | 359/665 |
| 6,545,816 | B1 | * | 4/2003 | Kroupenkine et al. | 359/665 |
| 6,778,328 | B1 | * | 8/2004 | Aizenberg et al. | 359/665 |
| 2003/0129501 | A1 | * | 7/2003 | Megens et al. | 430/1 |
| 2004/0027675 | A1 | * | 2/2004 | Wu et al. | 359/619 |
| 2004/0101785 | A1 | * | 5/2004 | Brown et al. | 430/321 |

FOREIGN PATENT DOCUMENTS

| | | | |
|---|---|---|---|
| WO | WO 99/18456 | * | 4/1999 |
| WO | WO 01/42540 | * | 6/2001 |

OTHER PUBLICATIONS

U.S. Appl. No. 10/139,124, filed May 3, 2002, Kroupenkine et al.*
U.S. Appl. No. 10/135,973, filed Apr. 30, 2002, Z. Bao et al.*
U.S. Appl. No. 10/378,412, filed Mar. 3, 2002, Aizenberg et al.*
U.S. Appl. No. 10/096,199, filed Mar. 12, 2002, Chandross et al.*
U.S. Appl. No. 10/321,027, filed Dec. 17, 2002, Reichmanis et al.*
U.S. Appl. No. 10/383,150, filed Mar. 6, 2003, G. Chen et al.*
U.S. Appl. No. 10/631,996, filed Jul. 31, 2003, Aizenberg et al.*
Schilling, Andreas et al., "Surface Profiles of Reflow Microlenses Under the Influence of Surface Tension and Gravity", Opt. Eg. 39(8) pp. 2171-2176, Society of Photo-Optical Instrument Engineers (Aug. 2000).
Danzerbrink, R. et al., "Deposition of Micropatterned Coating Using an Ink-Jet Technique," *Thin Solid Films* 351, pp. 115-118, Elsevier Science S.A (1999).

Commander;L. G. et al., "Variable Focal Length Microlenses," *Optics Communications* 177, Apr. 15, 2000, pp. 157-170.
Aizenberg, J., et al., "Calcitic microlenses as part of the photoreceptor system in brittlestars," *Nature*, vol. 412,.pp. 819-822, Aug. 23, 2001.
Tuberfield, A.J., "*Photonic Crystals Made by Holographic Lithography*," MRS. Bulletin, Aug. 2001, pp. 632-636.
Campbell, M., et al., "*Fabrication of Photonic Crystals for the Visible Spectrum by Holographic Lithography*," Nature, vol. 404, Mar. 2, 2000, pp. 53-56.
Shoji, S., et al., "*Photofabrication Of Three-Dimensional Photonic Crystals By Multibeam Laser Interference Into A Photopolymerizable Resin*,"Applied Physics Letters, vol. 76, No. 19, May 8, 2000, pp. 2668-2670.
Sundararajan, N., et at., "*Supercritical $CO_2$ Processing for Submicron Imaging of Fluoropolymers*,Chemistry of Materials," vol. 12, No. 1, Jan. 2000, pp. 41-48.
Yang. P.., et al: "*Hierarchically Ordered Oxides*," Science, vol. 282, Dec. 1998, pp. 2244-2246.
Lee,Y-J., Braun, P.V., "*Tunable Inverse Opal Hydrogel pH Sensors*," Adv. Mater. 2003, 15, No. 7-8, Apr. 17, 2003, pp. 563-566.
Wu, H., et al., "*Reduction Photolithography Using Microlens Arrays: Applications in Gray Scale Photolithography*," Analytical Chemistry, vol. 74, No. 14, Jul. 15, 2002, pp. 3267-3273.
Leister Microsystems, leaflet by Leister Microsystems entitled, "*Micro-optics—Imagine the Future of Light*," Sep. 2000, 4 pages.
Stokes; D.L, et al., "*Detection of E. coli using a microfluidics-based Antibody Biochip detection systems*," Fresenius, J. Anal Chem (2001) 369, pp. 295-301.
Jahns, J., et al., "*Microoptics for biomedical applications*," American Biotechnology Laboratory, No. 18, Oct. 2000, pp. 52 and 54.
Campbell, D.J., et al., "*Replication and Compression of Bulk and Surface Structures with Polydimethylsiloxane Elastomer*," Journal of Chemical Education, vol. 75, No. 4, Apr. 1999, pp. 537-541.
Avgeropoulos, et al., "*Synthesis and Morphological Behavior of Silicon-Containing Triblock Copolymers for. Nanostructure Applications*," Chem. Mater. 10 (1998) pp. 2109-2115. Shishido, A., et al., "*Direct fabrication of two-dimensional titanta arrays using interference photolithography*," Applied Physical Letters, vol. 79. No. 20, Nov. 12, 2001, pp. 3332-3334.
Yang, et al., "*Creating Periodic Three-Dimensional Structures by Multibeam Interference of Visible Laser*," Chemistry of Materials, vol. 14, No. 7, Jul. 2002, pp. 2831-2833.
Washizu, Masao, "Electrostatic Actuation of Liquid Droplets for Microreactor ApOlications," *IEEE Transactions on Industry Applications*, vol. 34, No. 4, Jul./Aug. 1998, pp. 732-737.
Abbot, N. L, et al., "*Potential-Dependent Wetting of Aqueous Solutions on Self-Assembled Monolayers Formed from 15-(Ferrocenylcarbonyl) pentadecanethiol on Gold*,"Langmuir 1994, American Chemical Society, vol. 10, pp. 1493-1497.

* cited by examiner

*Primary Examiner* — Daborah Chacko Davis
(74) *Attorney, Agent, or Firm* — Hitt Gaines

(57) ABSTRACT

A method includes exposing a first photoresist layer through a refractive mask to form a first pattern of above-threshold exposure spots in the first layer and exposing a second photoresist layer through the same mask to form a second pattern of above-threshold exposure spots in the second layer. Coordination numbers of exposure spots are larger in the first pattern than in the second pattern, nearest-neighbor pairs of the exposure spots have larger spacings in the first pattern than in the second pattern or largest ones of the exposure spots have larger diameters in the first pattern than in the second pattern.

19 Claims, 14 Drawing Sheets

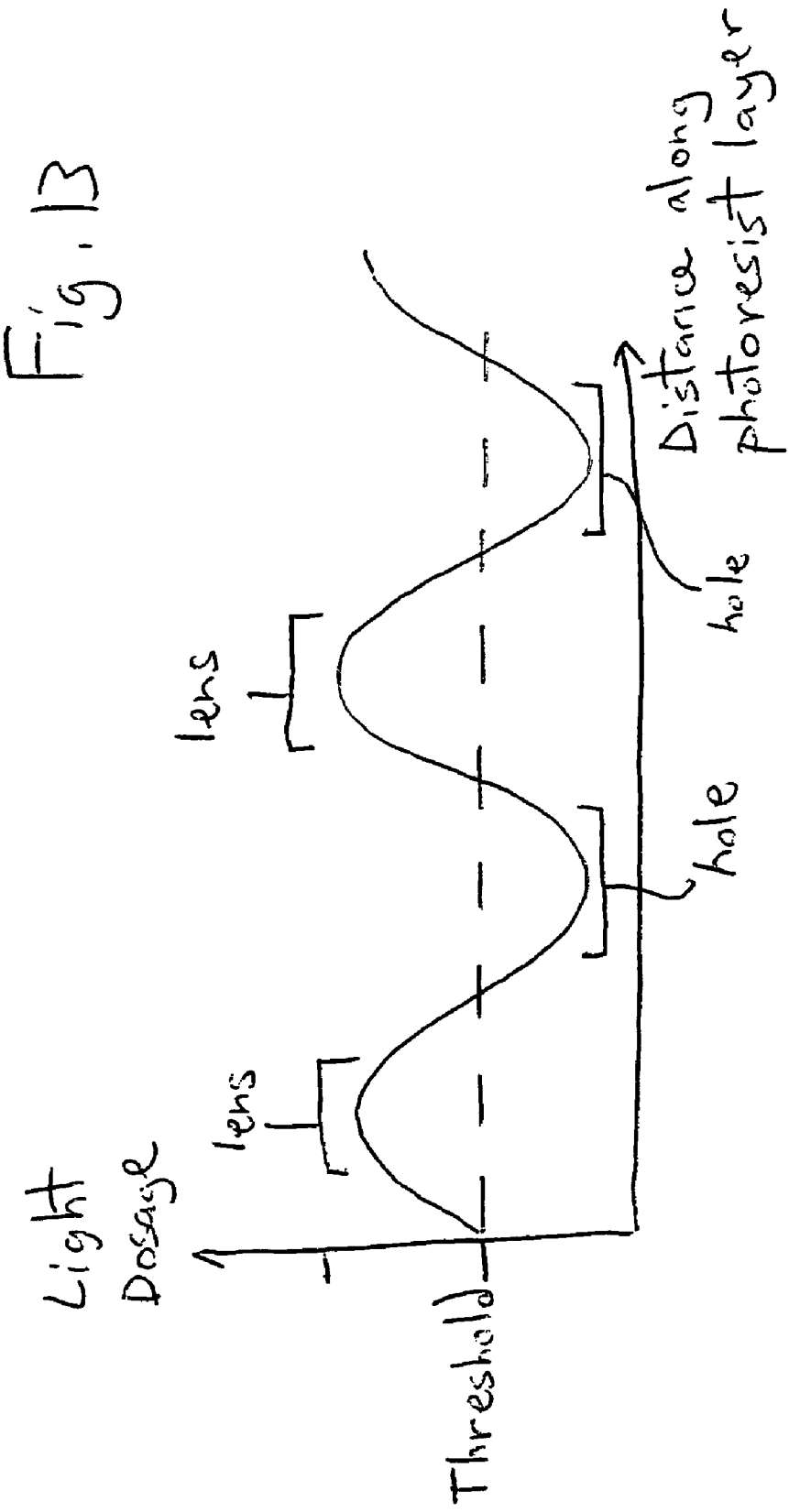

TUNABLE LITHOGRAPHY WITH A REFRACTIVE MASK

BACKGROUND

1. Field of the Invention

The invention relates generally to processing integrated circuits and more specifically to lithography.

2. Discussion of the Related Art

Fabrication techniques for integrated circuits often rely on a patterned photoresist layer to protect underlying structures during etches and material depositions, i.e., depositions of metals, dielectrics, or semiconductors. Typically, forming a patterned photoresist layer is a process with multiple steps. The steps include depositing a photoresist layer on a substrate, exposing the photoresist layer to a selected light pattern, curing the photoresist to cause chemical changes therein, and developing the cured photoresist to dissolve away either the exposed regions or unexposed regions. The developing step produces a layer covered by a pattern of holes that is either a negative or a positive image of the light exposure pattern.

In the fabrication of a patterned photoresist layer, a shadow, proximity, or projection lithography technique typically produces the light pattern used for the exposure step. Forming the desired light pattern involves passing collimated source light through a mask. The mask has a pattern of opaque regions that blocks portions of the wavefront of the collimated source light. Thus, passing the source light through the mask produce a spatial light pattern for exposing the layer of photoresist.

In the integrated circuit (IC) industry, the masks for lithographic processes are often expensive to fabricate due to the need for complex and fine patterns of opaque regions on such masks. Furthermore, ICs often have a sequence of different vertical levels and the production of each level often requires its own mask pattern. That is, a different mask is often needed to form each of the different layers of an IC. For these reasons, mask costs can be a significant portion of the total cost for fabricating multi-layer electronic ICs.

BRIEF SUMMARY

The various embodiments use a refractive mask to pattern photoresist layers. Herein, refractive masks have a regular or an irregular array of micro-lenses with or without an array of through-holes. Various embodiments can use a single refractive mask to pattern photoresist layers differently thereby offering the possibility of reducing the number of masks in IC fabrication.

In one aspect, a method includes exposing a first photoresist layer through a refractive mask to form a first pattern of above-threshold exposure spots in the first layer and exposing a second photoresist layer via the same refractive mask to form a second pattern of above-threshold exposure spots in the second layer. Coordination numbers of exposure spots are larger in the first pattern than in the second pattern, nearest-neighbor pairs of the exposure spots have larger spacings in the first pattern than in the second pattern or largest ones of the exposure spots have larger diameters in the first pattern than in the second pattern.

In another aspect, a method includes steps of exposing a first photoresist layer via a refractive mask to form a first patterned layer and performing a deposition on or an etch of the substrate under control of the first patterned layer. The method includes exposing a second photoresist layer via the same refractive mask to form a second patterned layer. The first photoresist layer is deposited over a first area of a substrate. The second photoresist layer covers a second area of the substrate, wherein the second area overlaps the first area. The refractive mask has a plurality of lenses.

In another aspect, a method includes steps of exposing a photoresist layer on a substrate through a refractive mask; developing the exposed layer to form a developed layer; and under control of the developed layer, performing either a deposition of material on the substrate or an etch of the substrate. The step of exposing forms a pattern of above-threshold exposure spots in the photoresist layer. The developed layer has a pattern corresponding to the pattern formed by the spots. The refractive mask is a mixed mask that has lenses and non-refractive windows dispersed between the lenses. The exposure spots are formed by light passing through the lenses and/or windows.

BRIEF DESCRIPTION OF THE DRAWINGS

FIG. 13 is a cross-section of a dose profile for a photoresist layer, wherein the light dose profile is suitable for fabricating a mixed refractive mask.

In the Figures, like reference numbers indicate features with similar functions.

In the Figures, dimensions of some features may be exaggerated with respect to those of other features to better illustrate various aspects.

The illustrative embodiments are described more fully with reference to the accompanying figures and detailed description. The inventions may, however, be embodied in various forms and are not limited to embodiments described herein.

DETAILED DESCRIPTION OF ILLUSTRATIVE EMBODIMENTS

Multi-beam interference techniques have enabled the production fine arrays of micro-lenses. Micro-lens diameters and separation distances may, e.g., be between about 0.5 µm and about 10 µm and preferably are in the range of about 1-6 µm.

Furthermore, by controlling light doses the same techniques are able to produce structures that combine arrays of micro-lenses and pores. The inventors have realized that such structures provide adjustable refractive masks for IC fabrication. In particular, a single refractive mask is able to produce different light patterns for exposing photoresist layers.

Figure 1A:
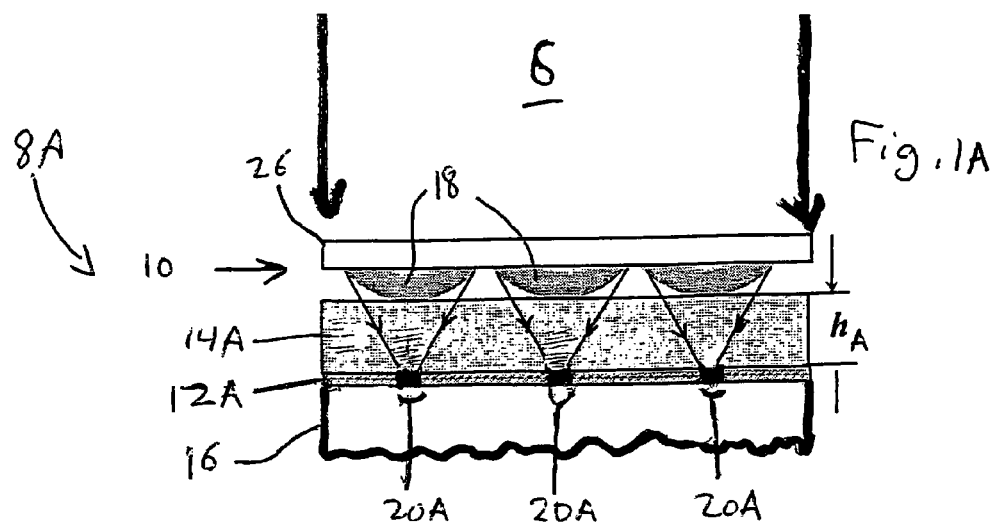
FIGS. 1A and 1B are cross-sectional views of setups in which the same refractive mask lithographically patterns two photoresist layers with the same pattern, but different feature sizes therein.
Figure 1B:
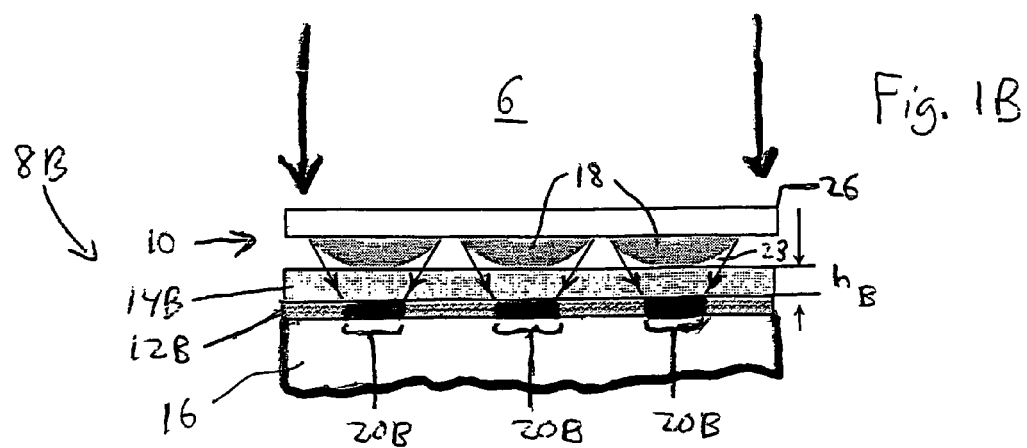

FIGS. 1A and 1B show setups 8A, 8B that use the same refractive mask 10 to lithographically pattern photoresist layer 12A and photoresist layer 12B differently. In each setup 8A, 8B, a transparent spacer layer 14A, 14B maintains the refractive mask 10 at a selected distance $h_A$, $h_B$ from the surface of the photoresist layer 12A, 12B during exposure thereof. An exemplary spacer layer 12A, 12B is slab of a transparent elastomeric polymer, e.g., polydimethylsiloxane (PDMS), which is cast onto the photoresist layer 12A. Subsequent to the exposure, curing and development of the exposed photoresist produces a hole-patterned photoresist (not shown) over the underlying substrate 16.

The refractive mask 10 includes micro-lenses 18, which focus and/or defocus incident light of light beam 6. Individual lenses 18 focus or defocus incident portion of the light beam 6 in regions 20A, 20B whose diameters differ from those of the lenses 18 themselves. Thus, passing collimated light through the refractive mask 10 produces a light pattern on the photoresist layer 12A, 12B that is not an exact copy of the refractive mask 10. Instead, due to focusing or defocusing, illuminated spots 20A, 20B on the photoresist layer 12A, 12B are only in correspondence with the pattern of micro-lenses 18 on the refractive mask 10.

In the setups 8A, 8B, the amount of focusing or defocusing depends on the distance $h_A$, $h_B$ between the array of lenses 18 and the photoresist layer 12A, 12B. The diameters of illuminated regions 20A, 20B are determined by the distance $h_A$, $h_B$. Thus, setting the distances $h_A$ and $h_B$ to be different in setups 8A and 8B changes the diameters of the illuminated regions 20A and 20B. By using spacer layers 14A and 14B of different thicknesses, setups 8A and 8B produce light patterns with different feature sizes on the layers 12A and 12B. For example, the diameters of region 20A and regions 20B differ by 10 percent or more and may differ by 50 percent or more.

Figure 2:
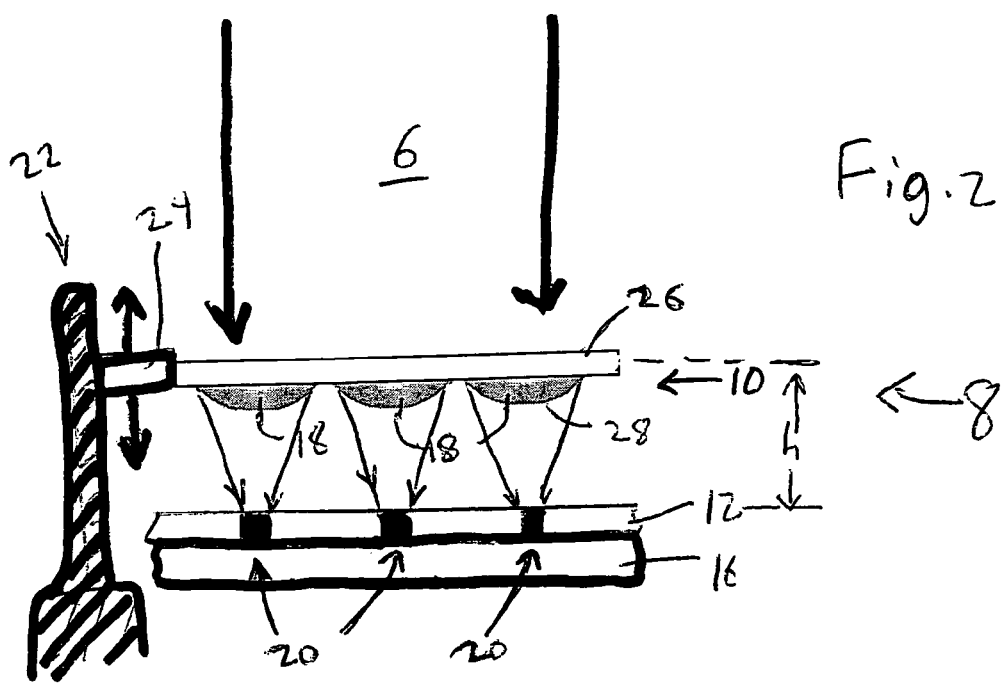
FIG. 2 is a cross-sectional view of a setup in which a refractive mask and a vertically movable stage enable adjustable patterning of photoresist layers.

FIG. 2 shows an alternate setup 8 for lithographically forming light patterns on a photoresist layer 12. The setup 8 includes a rigid device 22 having a movable mechanical stage 24. The mechanical stage 24 holds the refractive mask 10 parallel to the photoresist layer 12 and is able to move the refractive mask 10 vertically thereby varying the distance, h, between the micro-lenses 18 and the photoresist layer. The distance h and focal lengths of the micro-lenses 18 determine the diameters of illuminated regions 20 on the layer 12 of photoresist.

Referring to FIGS. 1A, 1B, and 2, exemplary micro-lenses 18 are curved or spherical surfaces 28 formed on a planar substrate 26, e.g., a glass plate. The curved surfaces 28 refract parallel incident light rays towards the focal points associated with the individual micro-lenses 18. In the refractive mask 10, the micro-optical lenses 18 are convex, have about equal focal lengths, and are arranged in a regular 2D array.

In other exemplary refractive masks 10, the various micro-lenses 18 may be only convex, only concave, or both convex and concave. Similarly, the various micro-lenses may have the same or different focal lengths. Also, the micro-lenses 18 may form a regular or an irregular array of any desired pattern on the substrate 26.

Figure 3:
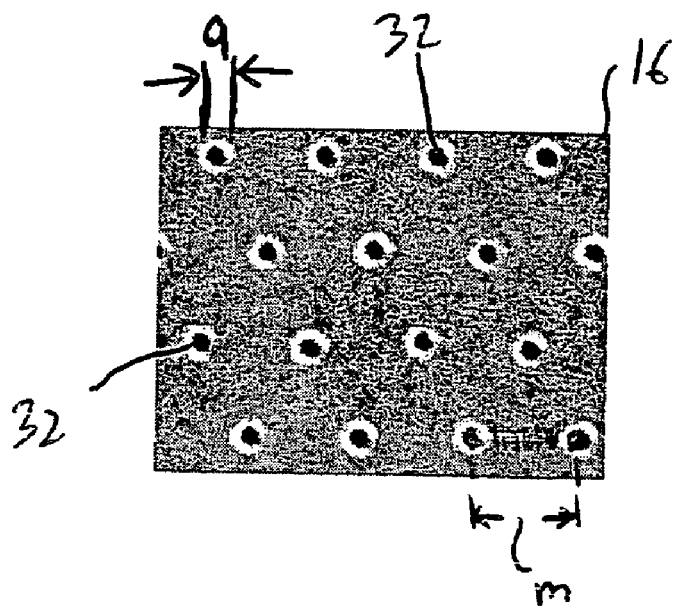
FIG. 3 is a top view of a photoresist that was patterned by a refractive mask according to one of the setups of FIGS. 1A-1B and 2.

FIG. 3 shows an exemplary array of holes 32 fabricated with a refractive mask having hexagonal lattice symmetry. The process of forming the holes 32 included patterning a photoresist layer under the control of the refractive mask and then, etching the substrate 16 under the control of the patterned photoresist. The distance, m, between adjacent holes 32 corresponds to the distance between adjacent micro-lenses of the original refractive mask. The hole diameters, a, depend on the patterning light dose, the distance h between the refractive mask and photoresist layer during the patterning, and the focal lengths of the micro-lenses.

Figure 4:
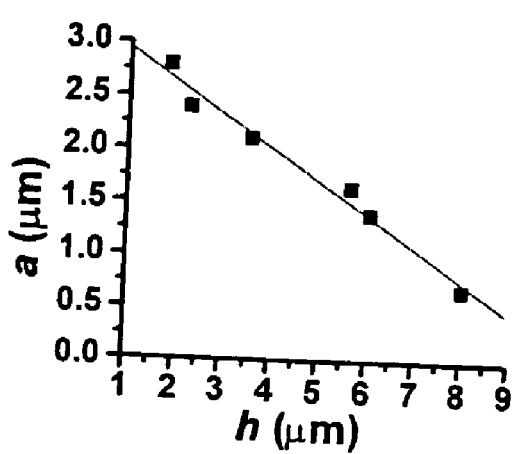
FIG. 4 illustrates how hole diameters in the patterned photoresist of FIG. 3 can depend on the distance between the refractive mask and the photoresist layer during the exposure step.

For fixed light doses, FIG. 4 plots hole-diameters, a, as a function of h in the setups 8A, 8B of FIGS. 1A-1B. The hole-diameters, a, scale approximately linearly with the distance, h, over a rather wide range of values of h.

Figure 5:
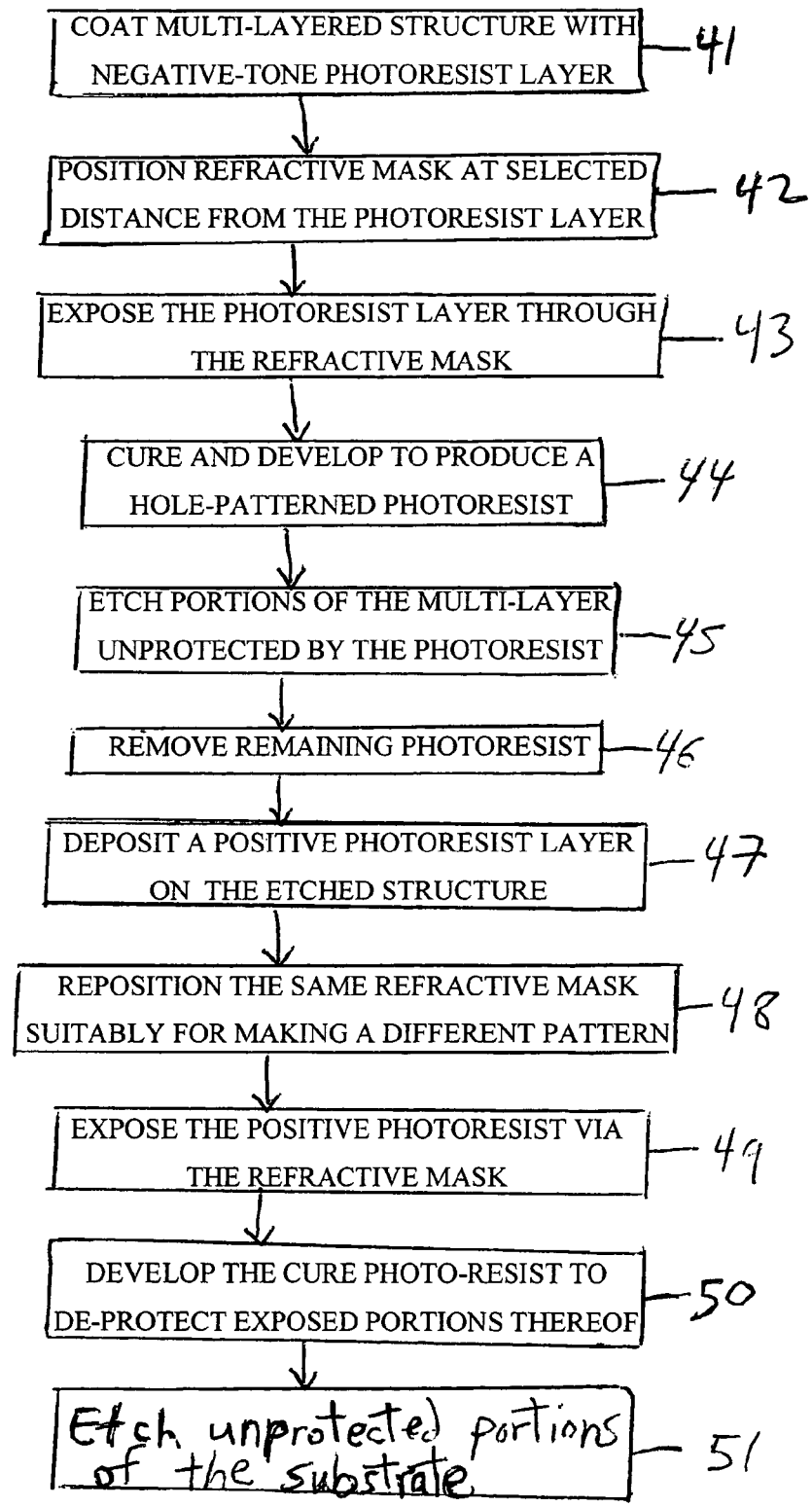
FIG. 5 is a flow chart illustrating a method of fabricating an integrated circuit structure with multiple features sizes using one refractive mask.

Setups 8A-8B and 8 enable fabricating multi-level electronic and optical integrated circuits (ICs), wherein more than one level of the IC is patterned with the same refractive mask. FIG. 5 illustrates a method 40 of forming such ICs with a refractive mask. The method 40 forms intermediate structures 60-65 shown in FIGS. 6A-6B.

Figure 6A:
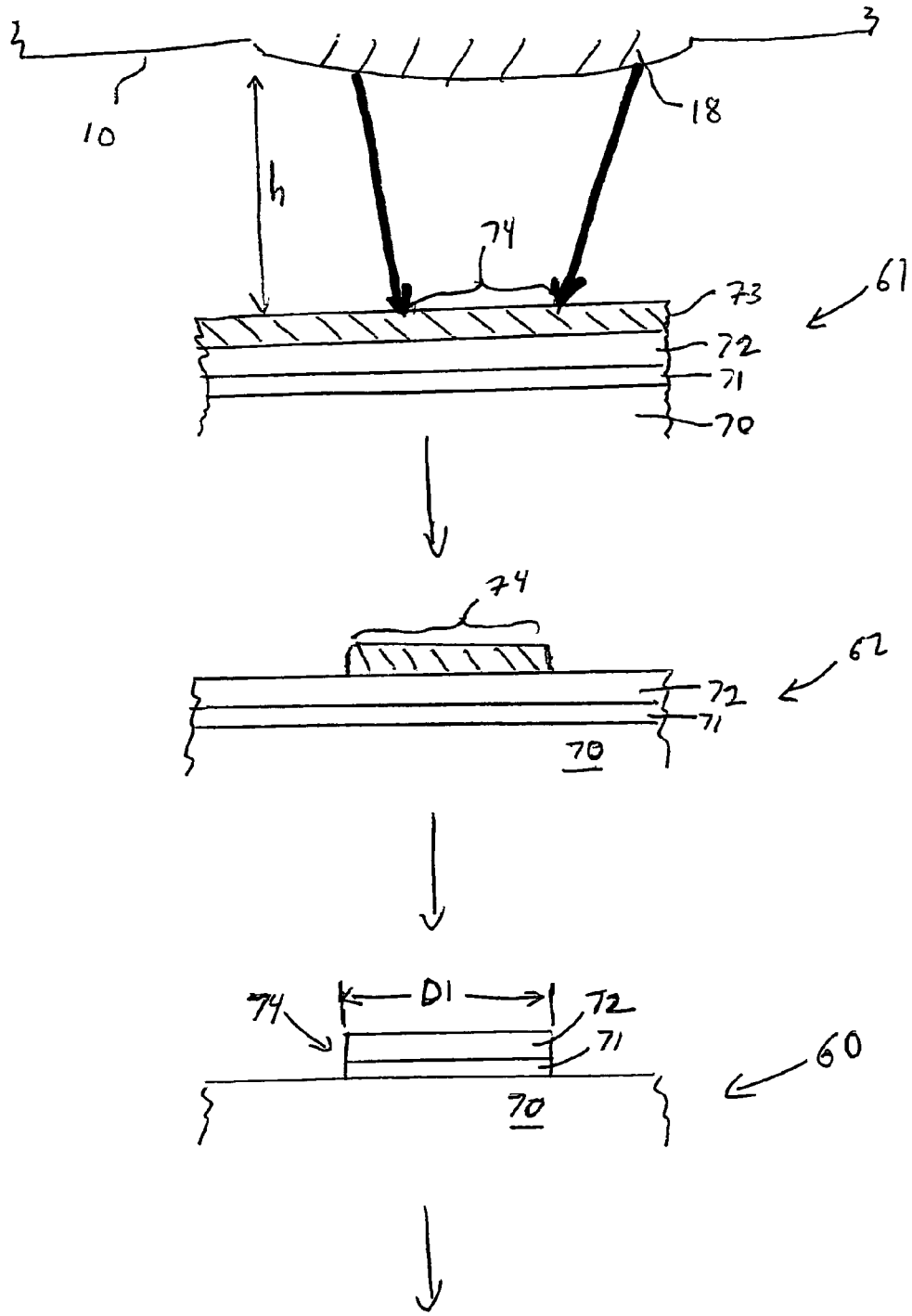
FIGS. 6A-6B are cross-sectional views of intermediate structures produced in the method of FIG. 5.

Referring to FIGS. 5 and 6A, the method 40 includes forming multi-layer structures 74 which includes disk-like shapes of diameter D1 on a planar dielectric or semiconductor substrate 70. The multi-layer structure 74 includes a top layer 72 and a middle layer 71. For example, the layer 72 may be a N-type semiconductor emitter, the layer 71 may be a P-type semiconductor base, and the substrate 70 may be a N-type semiconductor collector so that structure 60 will function as an NPN bipolar transistor.

Forming the layer structure 74 involves performing a multi-step process. First, the process includes coating the top surface of an unpatterned multi-layered structure with a conventional negative-tone photoresist layer 73 thereby producing intermediate structure 61 (step 41). An exemplary coating step involves spin coating the liquid photoresist onto the unpatterned multi-layer structure and then, evaporating solvent from the photoresist. Second, the process includes positioning refractive mask 10 so that convex micro-lenses 18 are at a preselected vertical distance h from the photoresist layer 73 (step 42). The distance h is selected so that each micro-lens 18 focuses parallel incident light onto a circular region of diameter D1 on the photoresist layer 73. Third, the process includes exposing the intermediate structure 61 to light through the refractive mask 10 so that a circular region of diameter 74 of the photoresist layer 73 receives an above-threshold light dose, e.g., a near ultraviolet light (step 43). Herein, an above-threshold exposure provides a light dose sufficient to change solidity properties of the photoresist with respect to developing. For a positive-tone resist, an above-threshold exposure causes a region of the photoresist to be removed by developing. For a negative-tone resist, an above-threshold exposure causes a region of the photoresist to remain after developing. Fourth, the process includes conventionally curing and developing the photoresist layer 73 to remove unexposed portions thereby producing intermediate semiconductor structure 62 (step 44). Then, the patterned photoresist protects circular regions of the original multi-layer structure. Fifth, the process includes performing a standard dry or wet etch to remove unprotected portions of the layers 72, 71, i.e., lateral regions not located under circular region 74 of photoresist (step 45). Sixth, the process includes removing remaining photoresist by performing a conventional plasma strip or wash with a suitable solvent (step 46). The removal step produces the structure 60 in which a disk-shaped multi-layer structure 74 of diameter D1 is located on the substrate 70.

Figure 6B:
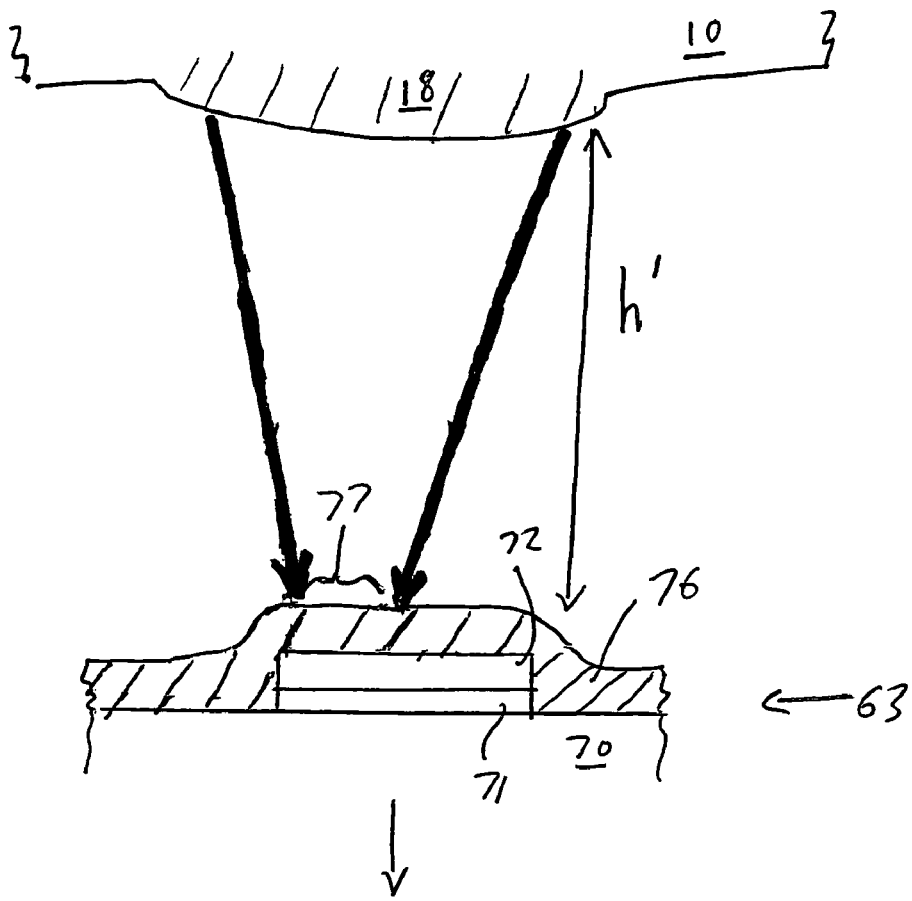
Figure 6B:
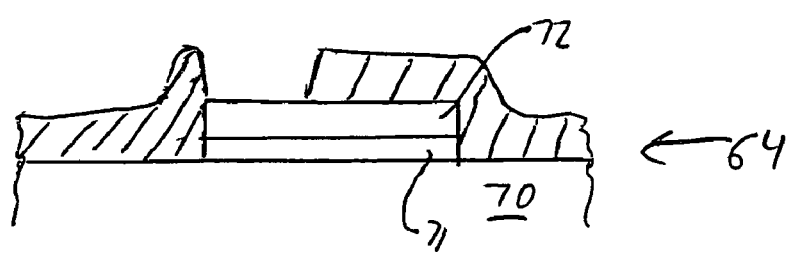
Figure 6B:
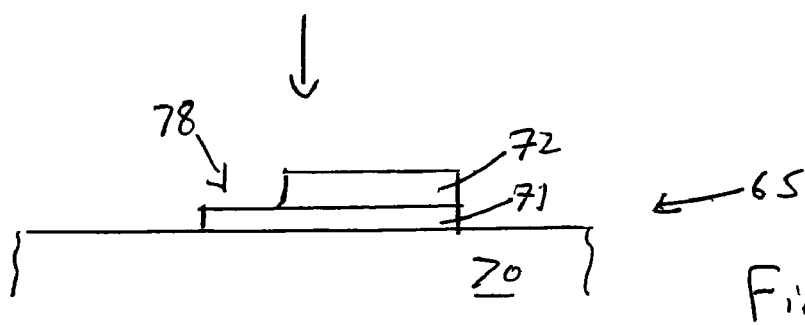

Referring to FIGS. 5 and 6B, the method 40 includes forming a circular hole 75 of diameter D2 through a portion of the multi-layer structure 74, wherein the diameter D2 is different from the diameter D1.

Forming the circular hole 75 involves performing another multi-step process. First, the process includes depositing a positive-tone photoresist layer 76 over intermediate structure 60 thereby forming intermediate structure 63 (step 47). For example, a conventional spin coating and evaporation may produce the photoresist layer 76. Second, the process includes laterally and vertically repositioning the same refractive mask 10 to a position suitable for another patterning (step 48). The vertical repositioning adjusts the distance between the micro-lenses 18 and the photo-resist layer 76 to h'. At the distance h', the micro-lenses 18 focus collimated incident light onto smaller circular spots 77 of diameter D2 on the second photoresist layer 76 than when the distance between the micro-lenses 18 and photoresist layer was h. The lateral repositioning aligns the micro-lens 18 so that the circular spots 77 have selected lateral positions over the circular multi-layer structures 74. An exemplary lateral position allows the circular spots 77 to touch portions of the boundaries of the first circular spots 74. Third, the process includes exposing the second circular spots 77 to light via the refractive mask 10 (step 49). Fourth, process includes curing the exposed photoresist to produce chemical changes therein and developing the cured photo-resist to de-protect the exposed portions of circular spots 77 (step 50). The developing step produces a windows in the photoresist that expose a portion of the top layer 72 as shown in intermediate structure 64. Fifth, the process includes dry or wet etching the intermediate structure 64 to remove the unprotected portion of the top layer 72 thereby producing hole 78 (step 51). After a standard plasma strip or solvent wash to remove the remaining photo-resist, the process produces final structure 65, which includes a multi-layer disk having a diameter D1 and a hole 78 having a diameter D2 and being located in the disk.

Thus, in different levels of an IC, the method 40 is able to fabricate structures of different diameters D1 and D2 by using only one refractive mask 10. In a third level, the steps 41-46 or the steps 47-51 can be repeated in a similar manner to produce additional features of diameters, e.g., D3, using the same refractive mask 10. The additional features may, e.g., have diameters D3, wherein D1≠D3 and D2≠D3.

Figure 6C:
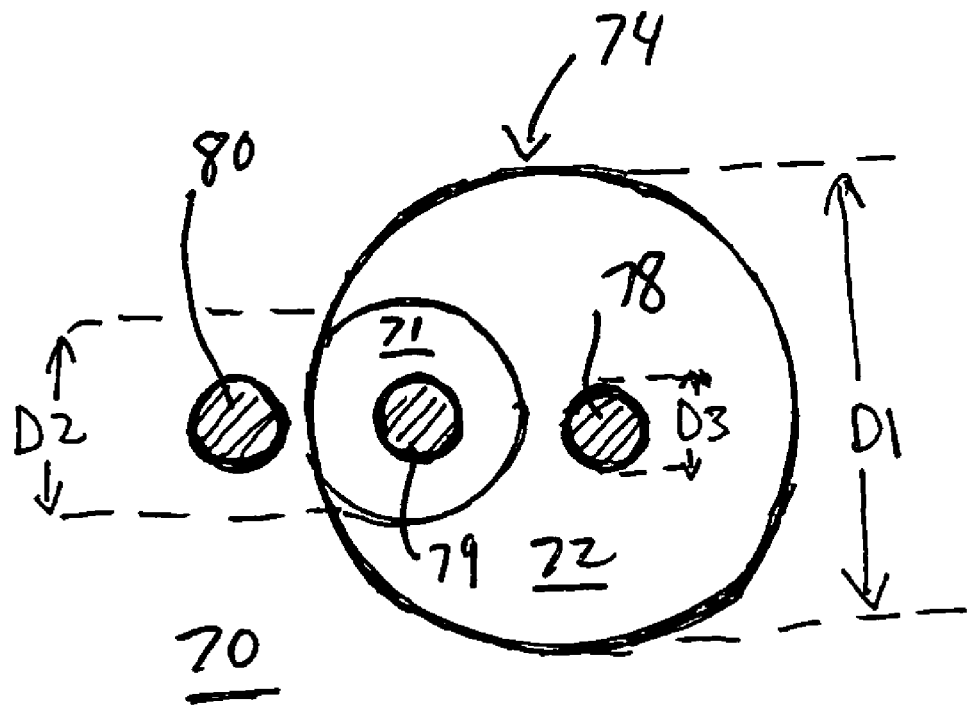
FIG. 6C is a schematic top view of a vertical structure for a bipolar transistor that can be fabricated with a single refractive mask by the method of FIG. 5.

FIG. 6C shows an exemplary bipolar transistor fabricated by the method 40. In particular, the steps 41-46 form the emitter layer 72 and base layers 71, and the steps 47-51 expose the extrinsic region of the base. Deposition and liftoff processes, based on the same refractive mask 10, produce metal emitter, base, and collector electrodes 78, 79, 80 as shown in FIG. 6C.

By vertical and horizontal repositioning, a single refractive mask 40 is able to produce an array of bipolar transistors. In the array, each transistor has three types of disk-like structures with different diameter, i.e., D1>D2>D3. That is, a single refractive mask 10 is able to produce arrays of structures in different fabrication levels of an IC, wherein the structures sizes vary with the fabrication level. For that reason, the refractive mask 10 can reduce the number of costly lithographic masks needed to produce the various levels of an IC.

Figure 7A:
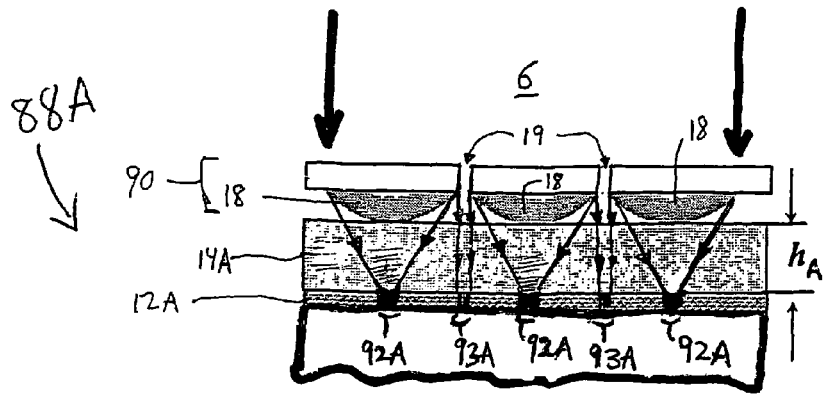
FIGS. 7A, 7B, and 7C are cross-sectional views of setups in which a single mixed refractive mask lithographically patterns various photoresist layers with different patterns.
Figure 7B:
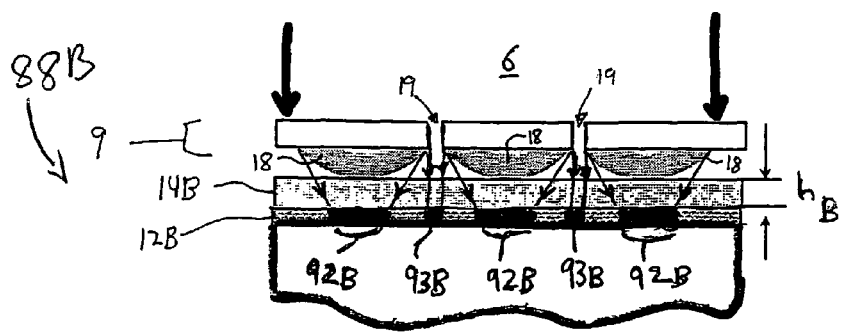
Figure 7C:
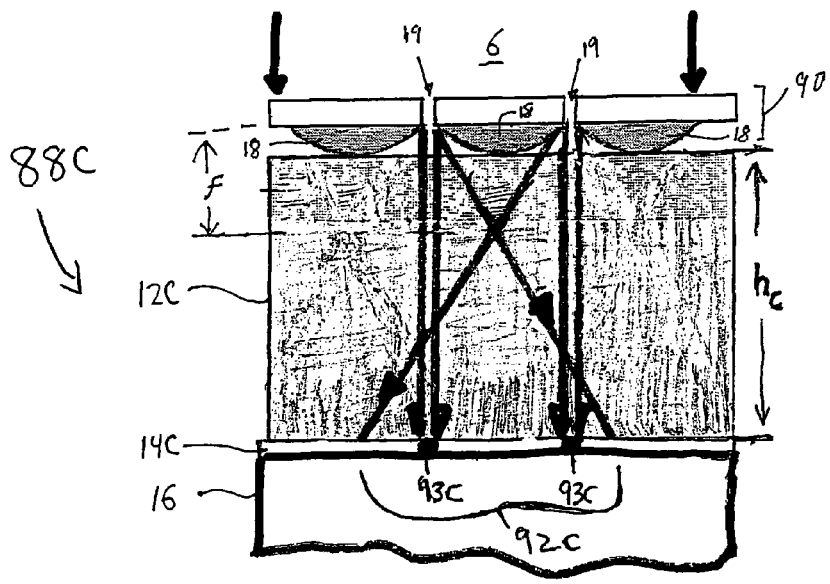

FIGS. 7A-7C illustrate alternate setups 88A, 88B, 88C for patterning a photoresist layer 12A, 12B, 12C. The alternate setups 88A-88C include a mixed refractive mask 90 that includes an array of convex micro-lenses 18 and an array of non-refractive windows 19. The non-refractive windows 19 are inter-dispersed between the micro-lenses 18. Exemplary non-refractive windows include pores or through-holes of circular cross section that allow light to pass through lateral regions of the mixed refractive mask 90, wherein the lateral regions are located between the micro-lenses 18. Light rays passing through the non-refractive windows 19 do not undergo refraction or substantial attenuation. The alternate setups 88A-88C also include transparent spacer layers 14A-14C, e.g., PDMS slabs. The space layers 14A, 14B, and 14C maintain the mixed refractive mask 90 at selected distances $h_A$, $h_B$, $h_B$ from the photoresist layers 12A, 12B, 12C located on planar substrate 16.

FIGS. 6A-6C illustrate that a refractive mask may pattern several levels of the same IC such that individual structures of one pattern are in correspondence with individual structures of another pattern, but have different sizes. A refractive mask can also produce patterns on different substrates such that individual structures of the pattern on one substrate correspond to individual structures of the pattern on another substrate, but have different sizes. This second method of using a refractive mask is, e.g., illustrated by FIGS. 1A and 1B where exposure spots 20A and exposure spots 20B are in correspond, but have different sizes.

In the alternate setups 88A-88C, both the micro-lenses 18 and the non-refractive windows 19 allow light from incident light beam 6 to pass through the refractive mask 90. Thus, both types of structures contribute to the total exposure of the photoresist layer 12A, 12B, 12C. Nevertheless, focusing and defocusing by micro-lenses 18 causes the different setups 88A-88C to produce qualitatively different patterning of the photoresist layers 12A-12C. The effects of the resulting light patterns change qualitatively with the distance, i.e., $h_A$, $h_B$, $h_B$, between the refractive mask 90 and the photoresist layer 12A-12C.

In setup 88A, the refractive mask 90 is positioned at a distance, $h_A$, such that the micro-lenses 18 strongly focus light from illumination beam 6 onto spots 92A on the photoresist layer 12A. By selecting the light dose suitably, the setup 88A is able to produce an above-threshold light dose in the spots 92A while producing a below-threshold illumination in spots 93A illuminated by the non-refractive windows 19 in the mixed refractive mask 90. Then, after curing and developing, only spots 92A of the photoresist layer 12A will be chemically changed by the light exposure. That is, the cured photoresist will have a hole-pattern that corresponds to the pattern associated only with the spots 92A.

In the setup 88B, the refractive mask 90 is positioned such that the micro-lenses 18 still focus light from the illumination beam 6 onto spots 92B on photoresist layer 12A. Nevertheless, the distance, $h_B$, is substantially less than the focal length, f, of the micro-lenses 18 so that exposures are similar in spots 92B produced by the micro-lenses 18 and in spots 93B produced by the non-refractive windows 19. By selecting the light dose suitably, the setup 88B is able to produce an above-threshold light dose in both spots 92B and spots 93B. Then, curing and developing will chemically change both spots 92B and spots 93B of the photoresist layer 12B. Thus, the cured photoresist (not shown) will have a hole-pattern that corresponds to the light pattern formed by both the micro-lenses 18 and the non-refractive windows 19.

In setup 88C, the refractive mask 90 is positioned at a distance, $h_C$, from the photoresist layer 12C. Here, the distance, $h_C$, is much larger than the focal length, f, of the micro-lenses 18. For that reason, the micro-lenses 18 defocus light from the incident beam 6 into large illuminated spots 92C on the photoresist layer 12C. Thus, the non-refractive windows 19 will illuminate spots 93C much more intensely than the micro-lenses 18 illuminate the spots 92C. By selecting the light dose suitably, the setup 88C is able to produce an above-threshold light dose in only the spots 93C. Then, curing and developing will chemically change only the spots 93C of the photoresist layer 12C for that reason, the cured photoresist (not shown) will have a hole-pattern that corresponds to the light pattern made only by the non-refractive windows 19.

Figure 8:
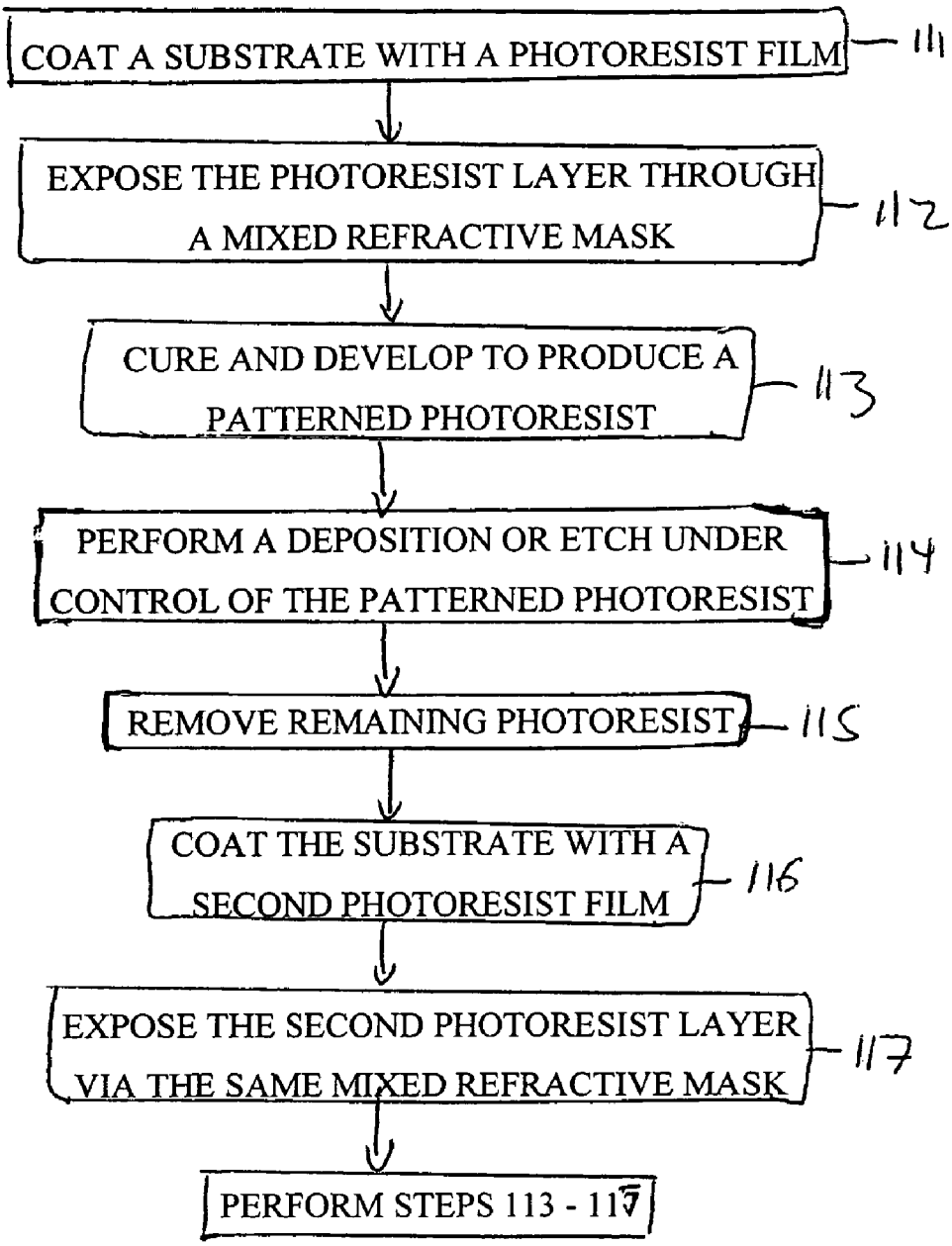
FIG. 8 is a flow chart illustrating a method of forming an integrated circuit with a mixed refractive mask.

FIG. 8 illustrates a method 110 of forming an IC with a mixed refractive mask, e.g., mixed refractive mask 90 of FIGS. 7A-7C. The method includes performing a conventional process to coat a planar substrate with a positive-tone or negative-tone photoresist film (step 111). The method 110 includes exposing the photoresist layer through the mixed refractive mask to form a pattern of exposed spots in which the photoresist layer has received above-threshold light doses, i.e., a dose sufficient to change solid properties of the photoresist after curing and developing (step 112). Depending on the distance between the mixed refractive mask and the photoresist film, the spots are exposed by light passing through micro-lenses of the refractive mask as shown in FIG. 7A, through non-refractive windows of the refractive mask as shown in FIG. 7C, or through both the micro-lenses and the non-refractive windows as shown in FIG. 7B. The method 110 also includes curing and developing the exposed photoresist film to form a hole-patterned photoresist (step 113). The developing involves washing the film with a suitable solvent. The solvent produces a hole-pattern by either dissolving areas of the photoresist layer that received an above-threshold light dose, i.e., for a positive-tone resist, or dissolving areas of the layer that received a below-threshold light dose, i.e., for negative-tone resist.

Figure 9A:
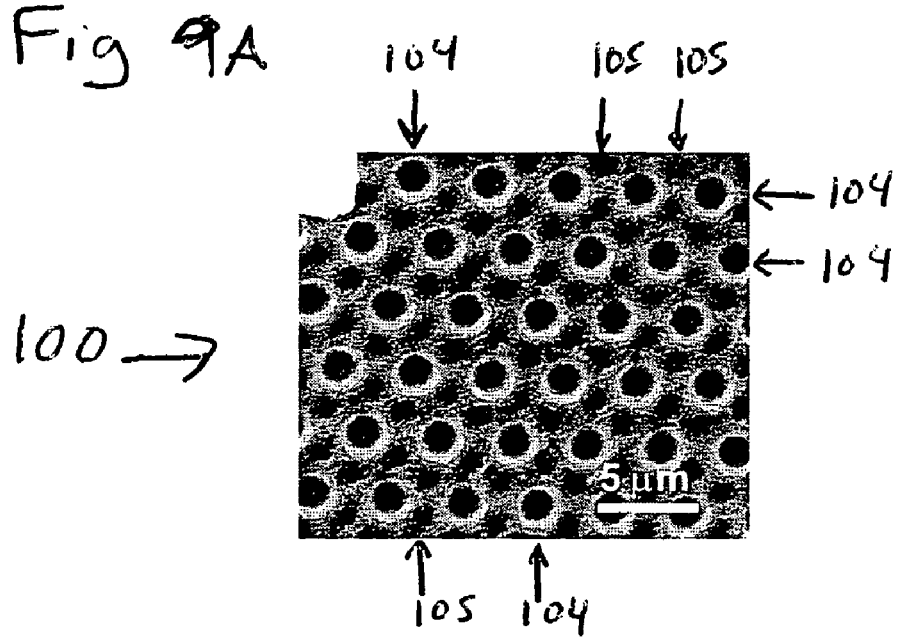
FIGS. 9A-9B are top views of differently patterned photoresists made with a single mixed refractive mask according to the method of FIG. 8.
Figure 9B:
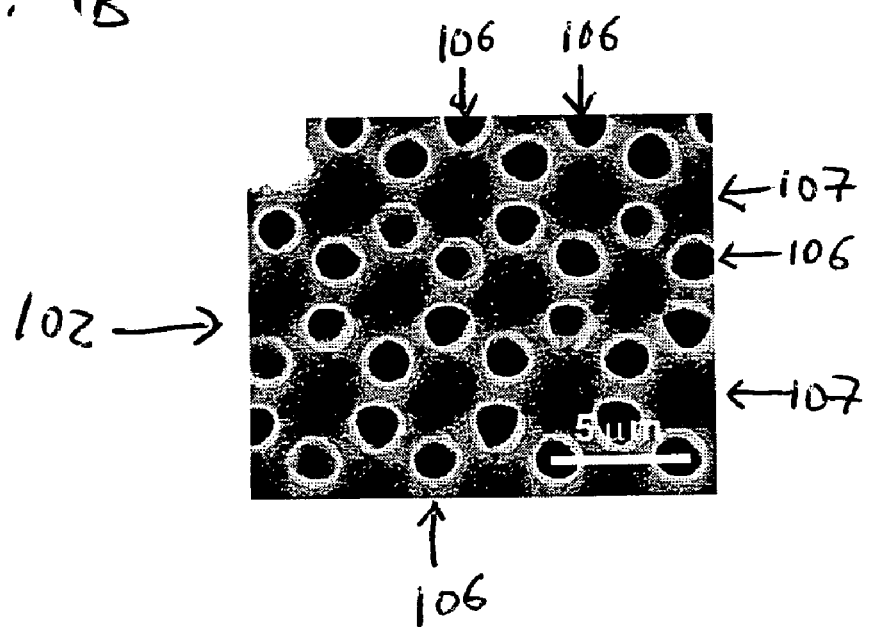

FIGS. 9A-9B show portions of developed photoresists 100, 102 made with one mixed refractive mask as described in steps 111-113. The unexposed films were positive-tone photoresists that are sold under the product name AZ5209 from Clariant Corporation, 70 Meister Avenue, Somerville, N.J. 08876. Both of the photoresists 100, 102 were patterned with the same mixed refractive mask, which had regular hexagonal lattice symmetry. During the exposure of photoresist 100, the mixed refractive mask was positioned so that the micro-lenses caused strong focusing of incident light onto spots in the photoresist film. Thus, the exposure produced through holes 104 where the photoresist film was exposed with light from the micro-lenses of the mask and only small indentations 105 where the photoresist film was exposed with light from the holes of the mask. During the exposure of photoresist 102, the same mixed refractive mask was positioned so that the micro-lenses caused defocusing of incident light over larger areas of the photoresist film. The exposure produces through holes 106 where the photoresist film was exposed with light from the circular non-refractive windows of the mask, i.e., through-holes, and only produced small indentations 107 where the film was exposed with light from the micro-lenses of the mask. These patterned photoresists 100, 102 illustrate that changing the vertical distance between the mixed refractive mask and the photoresist film can produce qualitatively different patterns of holes.

By varying the light dose and/or the distance between a mixed refractive mask and a photoresist, one can vary sizes of above-threshold exposure spots and/or the qualitative form of the pattern of above-threshold exposure spots. In different patterned photoresists, sizes of the above-threshold exposure spots and/or distances between nearest-neighbor pairs of said spots may differ by 10 percent or more. In different patterned photoresists, the patterns of said spots may form regular arrays with the same or different local lattice symmetries. For example, such regular arrays may have the same or different lattice point symmetry groups and may provide the same or different coordination numbers for nearest-neighbor exposure spots as illustrated by FIGS. 9A and 9B. Also, such mixed refractive masks may also be used to differently pattern photoresists that are located on the same substrate or on different substrates.

Referring again to FIG. 8, the method 110 includes performing a treatment under control of the patterned photoresist (step 114). Exemplary treatments include conventional depositions of material onto the substrate and conventional dry or wet etches of material from the substrate. The substrate is then treated to remove remaining photoresist, e.g., by washing with a solvent or by performing a plasma strip (step 115). The removal both removes the remaining photoresist and e.g., lifts off any material deposited on the photoresist.

Next, a new level of the integrated circuit is formed by depositing material over the same area of the substrate, e.g., the material may be metal, semiconductor, or dielectric. In some embodiments, the method 110 includes coating the free surface of the deposited material with a second photoresist layer to perform further patterning (step 116). Then, the method 110 includes exposing the second photoresist layer via the same mixed refractive mask to form a new pattern of spots where the exposure produces above-threshold light doses (step 117). Again, these spots are exposed by light that passes through micro-lenses of the refractive mask as shown in FIG. 7A, the circular non-refractive windows of the refractive mask as shown in FIG. 7C, or through both the micro-lenses and the non-refractive windows as shown in FIG. 7B. In particular, the spots with above-threshold light doses may form a different pattern over the substrate than the spots at above-step 112 if the distance between the mixed refractive mask and the substrate is different in steps 118 and 112. Nevertheless, individual spots or groups of spots from first exposure step 112 will correspond to individual spots or groups of spots from the second exposure step 118, because the same mixed refractive mask produced both exposure patterns. Finally, the method 110 would include repeating steps 113-115 to complete this next level of the IC.

Figure 10A:
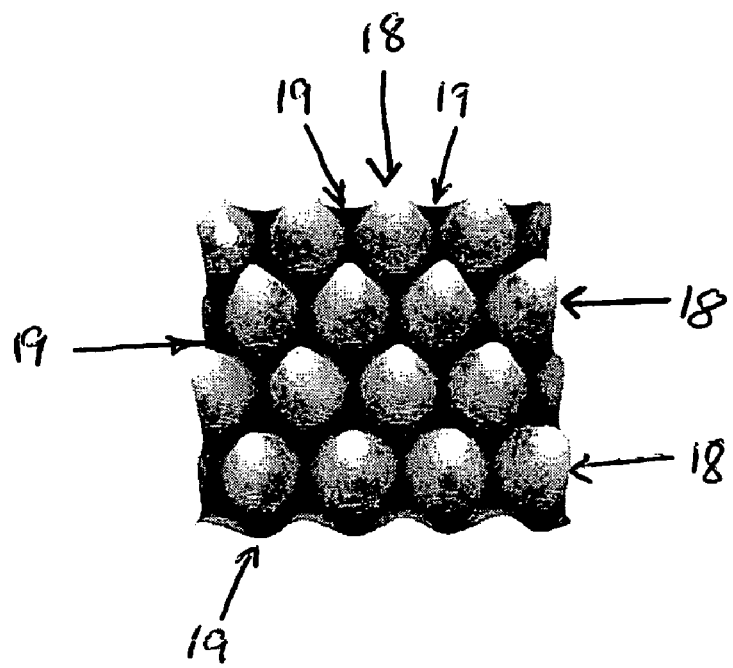
FIGS. 10A-10B are oblique views of exemplary mixed refractive masks suitable for use in setups of FIGS. 7A-7C and in the method of FIG. 8.
Figure 10B:
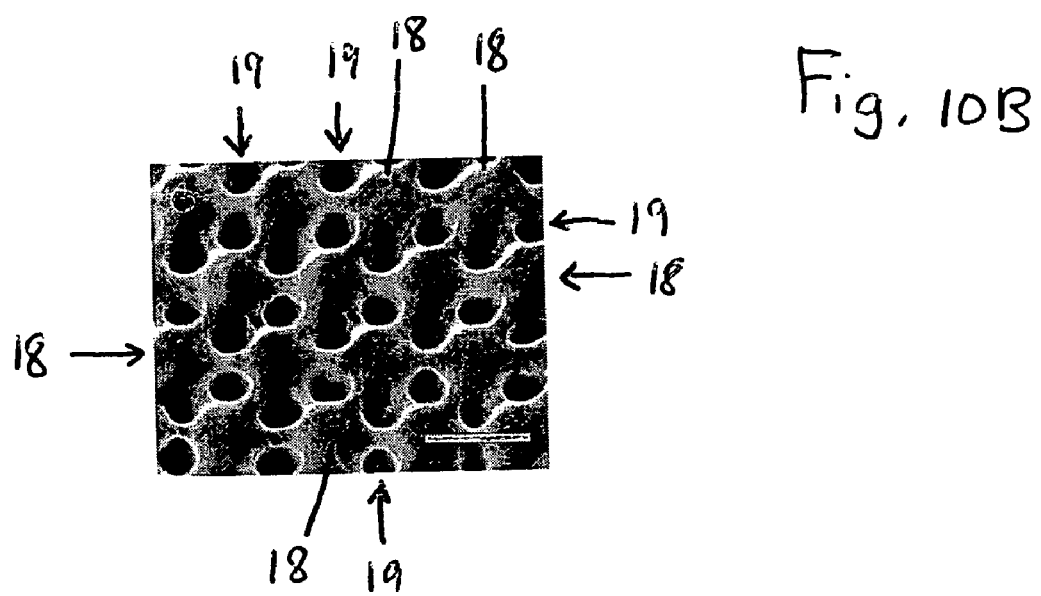

FIGS. 10A-10B show exemplary mixed refractive masks for use in setups 88A-88C of FIGS. 7A-7C. These refractive masks were made by multi-beam interference lithography. Multi-beam interference lithography enables fabricating mixed refractive masks in which micro-lens 18 and non-refractive windows 19, i.e., through-holes of circular cross section, are arranged on regular 2D lattices. The same technique also enables the fabrication of ordinary refractive masks with regular arrays of micro-lenses 18 but no holes 19, e.g., refractive masks 10 of FIGS. 1A-1B and 2. Planar structures fabricated via multi-beam interference can also be used as templates from which ordinary or mixed refractive masks are formed by conventional molding methods based on transparent elastomeric materials such as PDMS (not shown). Methods, materials, e.g., photoresists, and setups suitable for such fabrication methods for refractive masks are, e.g., described in U.S. patent application Ser. No. 10/631,996, filed Jul. 31, 2003 by Joanna Aizenberg et al ('996 application), and U.S. Patent Application Pub. No. 20030129501 of Mischa Megens et al, published Jul. 10, 2003 ('501 publication). Both of these U.S. patent applications are incorporated by reference herein in their entirety.

Figure 11:
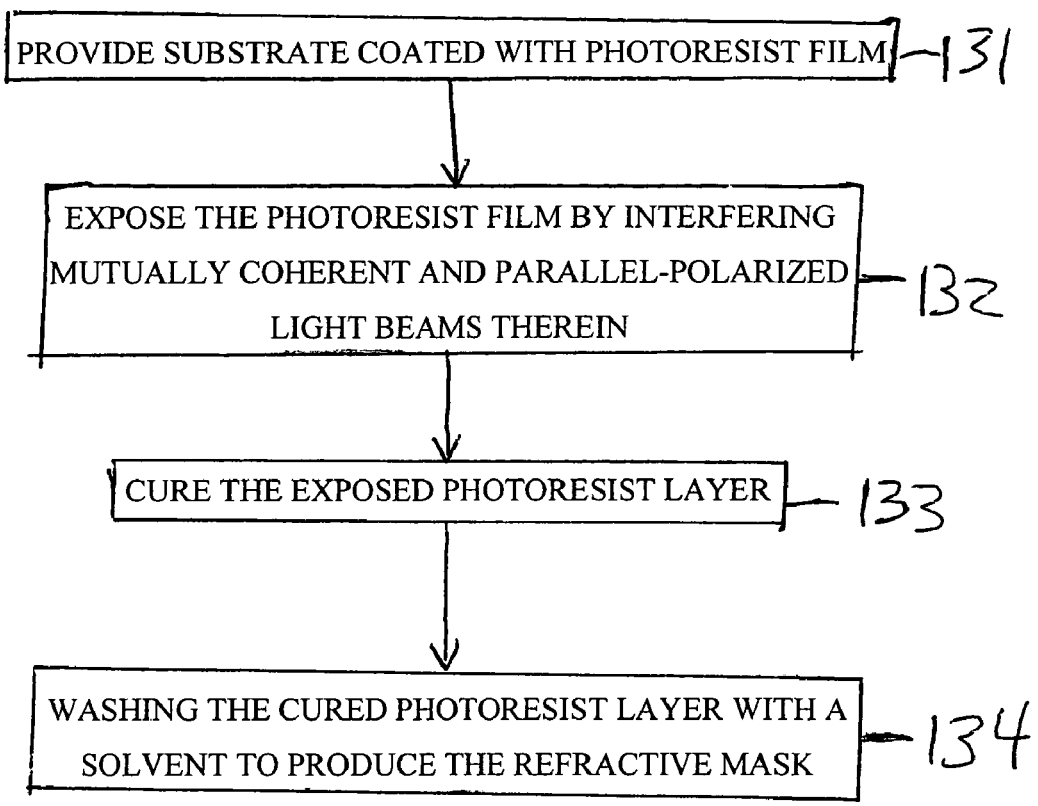
FIG. 11 is a flow chart illustrating a multi-beam interference method of fabricating mixed or ordinary refractive masks.
Figure 12A:
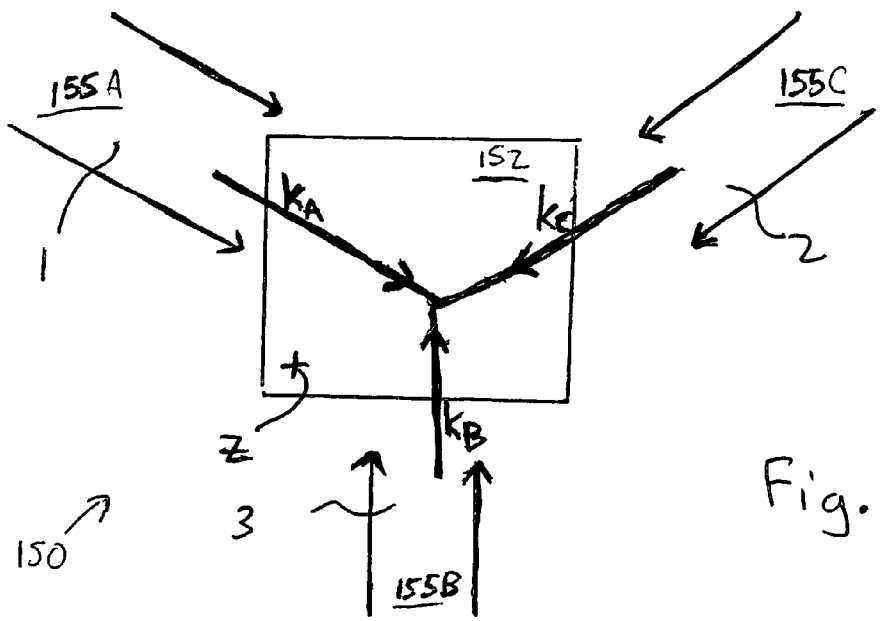
FIG. 12A is a top view of a three-beam interference setup for use in making refractive masks according to the method of FIG. 11.
Figure 12B:
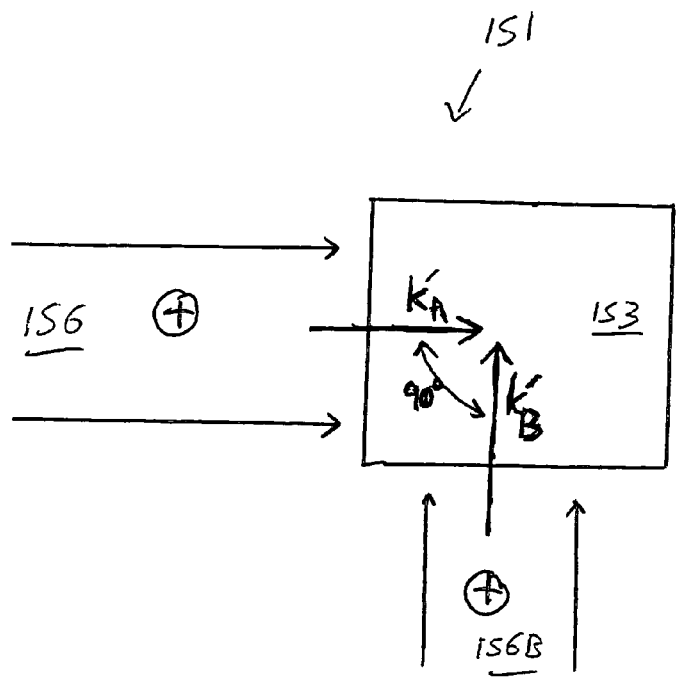
FIG. 12B is a top view of a two-beam interference setup for use in making refractive masks according to the method of FIG. 11.

FIG. 11 shows a multi-beam interference method 130 that can, e.g., use a setup 150, 151 of FIG. 12A or 12B to fabricate a refractive mask, e.g., mask 90 of FIGS. 7A-7C or mask 10 of FIGS. 1A-1B and 2.

The method 130 includes providing a transparent planar substrate, which is coated with an oligomer-based photoresist film 152, 153 (step 131). The substrate may, e.g., be a silica glass plate. The photoresist film may be made by a variety of conventional processes, e.g., spin coating. The photoresists are homogeneous, photo-sensitive, liquid mixtures. The mixtures typically include oligomers, dye molecules, initiator complexes, solvent, and may include cross-linkers for the oligomers. The dye molecules excite the initiator complexes in response to absorbing light, e.g., UV light. The initiator complexes stimulate production of photo-reaction products, e.g., acid. The photo-reaction products catalyze polymerization or cross-linking reactions among the oligomers under suitable conditions, e.g., baking.

Exemplary photoresists combine epoxide-type oligomers, visible dye molecules, photo-acid-generator (PAG) initiator complexes, and non-nucleophilic organic solvent. The epoxide oligomers 100 are available as a resin under product name EPON™ SU8 from Resolution Performance Products, 1600 Smith Street, 24th Floor, P.O. Box 4500, Houston, Tex. 77210-4500 USA. Suitable visible dye molecules are available under the product names HNu-535 and HNu-470 from Spectra Group Limited, Inc., 1722 Indian Wood Circle, Suite H, Maumee, Ohio 43537 USA. An alternate dye molecule dye molecule is known as Rose Bengal, is available from Aldrich Company, P.O. Box 2060, Milwaukee, Wis. 53201 USA. The PAG is available under product name SarCat® SR1012 from Sartomer Inc., Oaklands Corporate Center, 502 Thomas Jones Way Exton, Pa. 19341 USA. An alternate PAG is available under product name OPPI from UCB Chemicals Corp., 2000 Lake Park Drive, Smyrna (Atlanta), Ga. 30080 USA.

Exemplary photoresists are described in the above-incorporated '996 application and '501 publication.

An exemplary mixture for the photoresist is a solution with about 2 weight-percent (wt %) Irgacure 261, which is a PAG, and 30 wt % to 50 wt % SU8 in a solvent such as cyclopentanone. Irgacure 261 is sensitive to green light and is available from Ciba Specialty Chemicals Ciba Specialty Chemicals, 540 White Plains Road, P.O. Box 2005, Tarrytown, 10591-9005 N.Y. USA. To form films 152, 153, the above-described exemplary solution is spin coated onto a precleaned glass substrate and then baked at 90° C. to remove all solvent. The resulting films have thicknesses of about 5-15 µm.

Next, the method 130 includes exposing the photoresist layer with a light intensity pattern produced by interfering mutually coherent light beams therein, e.g., near-ultraviolet light beams (step 132). Exemplary setups 150, 151 interfere the light beams by directing some components of the beam momenta, i.e., $\{k_A, k_B, k_C\}$ or $\{k_A', k_B'\}$, along the photoresist layers' planes and keeping the beams polarizations parallel to each other. To generate patterns with regular 2D lattice symmetries, the interfering beams make about equal angles with respect to each other and have about equal intensities. In FIG. 12A, the setup 150 generates an intensity pattern in the photoresist layer 152 with a 2D hexagonal lattice symmetry by interfering three equal intensity light beams 155A, 155B, and 155C. The three beams are symmetrically placed with respect to the z-axis, i.e., the axis normal to the photoresist layer 152, and make angles of about 2 degrees with respect to the z-axis.

In FIG. 12B, the setup 151 generates an intensity pattern in the photoresist layer 153 with a 2D square symmetry by interfering light beams 156A and 156B at relative right angles.

An exemplary exposure step 132 includes splitting a 532 nm light beam from a continuous wave diode-pumped solid-state laser nm into three mutually coherent beams. The exposure step includes interfering the three mutually coherent beams in the plane of the photoresist over a region having a diameter of about 4-5 millimeters. Exemplary wave vectors for the three interfering beam are: $k_A=(2\pi/b)[0.035, 0, 0.999]$, $k_B=(2\pi/b)[-0.017, 0.030, 0.999]$, and $k_C=(2\pi/b)[-0.017, -0.030, 0.999]$ where "b" is proportional to the wavelength of the light. The three interfering beams have parallel polarizations.

The exposing step 132 produces a light dose pattern in the photoresist layer 152, 153. Various negative-tone photoresists have non-linear responses to light. In particular, each negative-tone photoresist has an exposure-threshold for the light dose. In a region with an above-threshold dose, the light exposure will cause sufficient polymerization or cross-linking after curing. Then, such a region will be insoluble to the developing solvent and will, e.g., become a lens-like structure after developing. To produce micro-lenses, the difference of the light dose between strongly exposed regions and adjacent weakly exposed regions is selected to be above the threshold dose for the photoresist. In the weakly exposed regions, a below-threshold dose causes insufficient polymerization or cross-linking after curing. Then, such regions will be soluble to the developing solvent and will become empty regions or pores after developing.

Thus, fabrication of the various refractive masks requires that light doses be below the lithography threshold in some regions of the photoresist layer 152, 153 and above the threshold in other regions of the photoresist layer 152, 153. For the above-described exemplary photoresist films based on Irgacure 261 and SU8, about 1-6 seconds of exposure to about 2 watts of 532 nm generates photo-acids. The smooth variations in light intensities of interfering beams cause globular above-threshold dosage regions to be surrounded by below-threshold dosage regions. The boundaries of the above-threshold exposure regions have rounded edges as needed for lens-like shapes. Resulting lens contours may be amplified by varying factors such as the quantum efficiency of photosensitive molecules; the nonlinear relationship between the dose, polymerization, and solubility changes in photoresists; and/or the shrinkage of the cured and developed photoresist. Micro-lens sizes, shapes, and lattice symmetries depend on wave vectors and polarizations of interfering beams. Pore or through-hole sizes depend on total light dosage.

FIG. 13 shows a cross section of a light dose profile that is suitable for producing a mixed refractive mask. For an ordinary refractive mask, the light dose is preferably higher in regions between the lenses to avoid the formation of pores through the photoresist layer 152, 153 after curing and developing.

Similar considerations apply for embodiments using positive-tone resists with above and below the lithography threshold interchanged.

Referring to again to FIG. 11, the method 130 also includes curing the exposed photoresist layer 152, 153 after subjecting the layer to a suitable light dose (step 133). For example, the curing step may include baking the photoresist layer 152, 153. For the above-described exemplary photoresist films based on Irgacure 261 and SU8, baking stimulates acid-catalyzed ring-opening reactions of epoxy groups in exposed portions of the films thereby causing cross-linking due to the presence of acid.

Finally, the method 130 includes washing the cured photoresist layer 152, 153 with a suitable solvent to remove unpolymerized or cross-linked oligomers thereby producing the refractive mask (step 134). For the above-described exemplary photoresist films based on Irgacure 261 and SU8, a suitable developing solvent is propylene glycol methyl ether acetate (PGMEA). The solvent removes unexposed and weakly exposed portions of the films, e.g., to produce lens structures and possibly pores.

From the disclosure, drawings, and claims, other embodiments of the invention will be apparent to those skilled in the art.

What is claimed is:

1. A method, comprising:
exposing a first photoresist layer through a refractive mask to form a first pattern of above-threshold exposure spots in the first layer; and
exposing a second photoresist layer through the same refractive mask to form a second pattern of above-threshold exposure spots in the second layer; and
wherein coordination numbers of the exposure spots are larger in the first pattern than in the second pattern or the exposure spots form regular lattices with different local lattice symmetries in the first pattern and the second pattern.

2. The method of claim 1, wherein nearest-neighbor pairs of the exposure spots have larger spacings in the first pattern than in the second pattern.

3. The method of claim 1, wherein the largest ones of the exposure spots have larger diameters in the first pattern than in the second pattern.

4. The method of claim 1 wherein either nearest-neighbor pairs of the exposure spots have spacings that are at least 10 percent larger in the first pattern than in the second pattern, or, largest ones of the exposure spots have diameters that are at least 10 percent larger in the first pattern than in the second pattern.

5. The method of claim 1, further comprising:
depositing photoresist on a surface of a substrate to produce the first photoresist layer; and
depositing photoresist over the surface of the substrate to produce the second photoresist layer.

6. The method of claim 1, wherein the first pattern has a different local point symmetry group than the second pattern.

7. A method, comprising:
exposing a first photoresist layer via a refractive mask to form a first patterned layer, the first photoresist layer being deposited over a first area of a substrate, the refractive mask having a plurality of lenses;
under control of the first patterned layer, performing a deposition on the substrate or an etch of the substrate; and
then, exposing a second photoresist layer via the same refractive mask to form a second patterned layer, the second photoresist layer covering a second area of the substrate, the first and second areas overlapping; and
wherein the refractive mask includes non-refractive windows dispersed between the lenses therein; and
wherein the windows produce above threshold light doses in one of the photoresist layers during one of the exposing steps and produce below threshold light doses in the other of the photoresist layers during the other of the exposing steps.

8. The method of claim 7, wherein the steps of exposing produce above threshold light doses in convex spots on the first and second photoresist layers, the spots on the first photoresist layer being in correspondence with the spots on the second photoresist layer.

9. The method of claim 8, wherein a portion of the spots on the second photoresist layer have smaller diameters than the corresponding spots on the first photoresist layer.

10. The method of claim 8, wherein the spots on the first photoresist layer are laterally displaced by a vector along the substrate from the corresponding spots on the second photoresist layer, the vector being the same for each spot of the first photoresist layer.

11. The method of claim 7, wherein some of the lenses of the refractive mask illuminate spots of first diameters on the first photoresist layer during the first exposing step and illuminate corresponding spots of different second diameters on the second photoresist layer during the second exposing step.

12. A method, comprising:
exposing a first photoresist layer through a refractive mask to form a pattern of above threshold exposure spots in the first photoresist layer, the first photoresist layer covering a first area of a substrate;
developing the exposed layer to form a developed layer, the developed layer having a pattern corresponding to the pattern formed by the exposure spots; and
under control of the developed layer, performing a deposition on the substrate or an etch of the substrate; and
wherein the refractive mask has lenses and has non-refractive windows dispersed between the lenses, some of the exposure spots being formed by light passing via the windows.

13. The method of claim 12, wherein others of the exposure spots are formed by light passing through the lenses.

14. The method of claim 12, further comprising:
exposing a second photoresist layer via the same refractive mask to form a pattern of above threshold exposure spots in the second photoresist layer, the second photoresist layer being deposited over a second area of the substrate, the first and second areas of the substrate overlapping.

15. The method of claim 14, wherein individual ones of the exposure spots in the first photoresist layer correspond to individual ones of the exposure spots in the second photoresist layer.

16. The method of claim 15, wherein some of the exposure spots in the first photoresist layer have smaller diameters than the corresponding exposure spots in the second photoresist layer.

17. The method of claim 14, wherein groups of the exposure spots in the first photoresist layer correspond to single spots in the second photoresist layer.

18. The method of claim 14, wherein the windows produce above threshold light doses in the second photoresist layer during the action of exposing a second photoresist layer.

19. The method of claim 12, wherein the exposure spots form a regular lattice in the photoresist layer.

* * * * *